United States Patent
Stall

[11] Patent Number: 4,592,927
[45] Date of Patent: Jun. 3, 1986

[54] GROWTH OF OXIDE THIN FILMS USING SOLID OXYGEN SOURCES

[75] Inventor: Richard A. Stall, Berkeley Heights, N.J.

[73] Assignee: AT&T Bell Laboratories, Murray Hill, N.J.

[21] Appl. No.: 585,014

[22] Filed: Mar. 2, 1984

Related U.S. Application Data

[63] Continuation of Ser. No. 422,673, Sep. 24, 1982, abandoned.

[51] Int. Cl.[4] ............................................. C23C 16/40
[52] U.S. Cl. .................................. 427/87; 427/126.3; 427/255; 427/255.3
[58] Field of Search ............... 427/255.3, 126.3, 87, 427/82, 93, 255

[56] References Cited

U.S. PATENT DOCUMENTS 4,199,383  4/1980  Wittry .............................. 427/255.3
4,374,160  2/1983  Yoshioka et al. ................. 427/126.3

OTHER PUBLICATIONS

Grant et al., "GaAs Surface Passivation for Device Applications", Tech. Report AFWAL-TR-80-1104, pp. 1-26, Jul. 1980.

Cho et al., "Molecular Beam Epitaxy", Progress in Solid-State Chemistry, vol. 10, Part 3, pp. 157-191, 1975.

*Primary Examiner*—Sadie L. Childs
*Attorney, Agent, or Firm*—Michael J. Urbano

[57] ABSTRACT

Oxide ($R_mO_n$) films are grown by evaporation from separate sources of element (R) and an oxide ($M_rO_s$) which serves as the oxygen source. The oxide ($M_rO_s$) should sublimate congruently; i.e., without decomposing into oxygen and its constituent element (M). On the growth surface this oxide ($M_rO_s$) can react with the element (R) to form another oxide ($R_mO_n$) that is thermodynamically more stable:

$$mR + M_rO_s \rightarrow R_mO_n + M_rO_{s-n}$$

Using this technique, films of $Al_2O_3$, MgO, $SiO_2$, and $MgAl_2O_4$ have been grown using $As_2O_3$ or $Sb_2O_3$ as the oxygen source.

11 Claims, 1 Drawing Figure

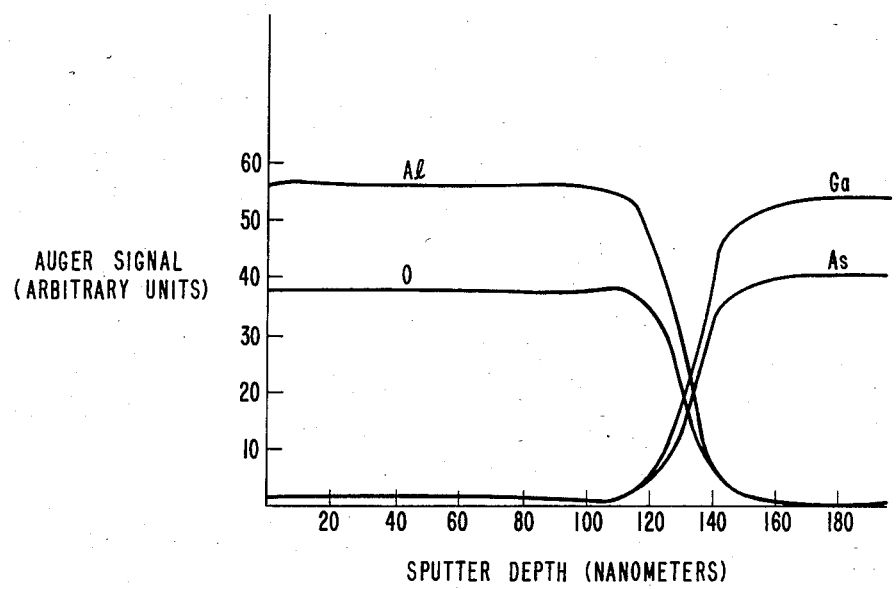

GROWTH OF OXIDE THIN FILMS USING SOLID OXYGEN SOURCES

This application is a continuation of application Ser. No. 422,673, filed Sept. 24, 1982 now abandoned.

BACKGROUND OF THE INVENTION

This invention relates to the fabrication of thin film oxides.

While oxide films can be grown using electron beam heating of the oxide source, the dissociation of the oxide results in a high background pressure of $O_2$ in the chamber. Moreover, when an element is evaporated in an oxygen ambient, a very high $O_2$ background pressure or very slow growth rate is necessary to form an oxide because of the short residence time of $O_2$ on the growth surface.

Another approach to growth of an oxide (e.g., $Al_2O_3$) employs a Molecular Beam Epitaxy (MBE) chamber to evaporate the metal (e.g., Al) in a background of about $10^{-5}$ Torr of $O_2$. However, there are several difficulties associated with this approach. First, the high $O_2$ background will oxidize the hot filaments of the effusion cells, ion gauges, etc. as well as the evaporation charges. Secondly, the $O_2$ will react with the hot elements in the chamber to form high levels of CO and $CO_2$, which could lead to undesirable carbon incorporation into the films. Finally, the kinetics of the reaction of Al with $O_2$ are slow enough that the growth rate must be very slow or the $O_2$ pressure very high so that the Al will fully oxidize. For example, R. W. Grant et al attempted to grow $Al_2O_3$ in an ambient of $10^{-4}$ Torr of $O_2$ by evaporating Al at a rate of 1 A/sec at a growth temperature of 25° C. They reported in AFWAL-TR-80-1104, p. 25 (1980) that a metallic Al layer resulted with "no obvious difference from Al deposited under UHV conditions with no $O_2$ ambient".

SUMMARY OF THE INVENTION

The present invention enables oxide ($R_mO_n$) thin films to be grown without an $O_2$ ambient by using a second oxide as the oxygen source. From separate effusion cells, at least one metal and/or semiconductor (R) and an oxide $M_rO_s$, the oxygen source, are evaporated onto a substrate in a chamber. When $R_mO_n$ is thermodynamically more stable (i.e., has a lower Gibbs free energy) than $M_rO_s$, the following reaction takes place;

$$mR + M_rO_s \rightarrow R_mO_n + M_rO_{s-n} \quad (1)$$

where r, s, m, and n are integers. When $M_rO_{s-n}$ is volatile at the growth temperature, an oxide film of $R_mO_n$ results. This growth technique avoids the difficulties associated with backfilling the chamber with $O_2$. Using a MBE system, $M_rO_s$ can be chosen to have a relatively low vapor pressure so that it will stick to the walls of the MBE chamber and its cryopanels. Thus, the heating filaments that are not in line-of-sight of the $M_rO_s$ effusion cell are protected from oxidation, and the background pressures of CO, $O_2$, $CO_2$, etc. are kept low. Finally, the residence time of $M_rO_s$ on the surface is long compared to $O_2$. This property greatly decreases the flux of $M_rO_s$ compared with $O_2$ necessary for growth of the oxides.

BRIEF DESCRIPTION OF THE DRAWING

My invention, together with its various features and advantages, can be readily understood from the following, more detailed description taken in conjunction with the accompanying drawing, in which the sole FIGURE is a sputter Auger profile of an $Al_2O_3$ film grown on GaAs at 350° C.

DETAILED DESCRIPTION

In the following examples, materials, temperatures, pressures, and other operating conditions are provided by way of illustration only, and, unless otherwise stated, are not intended to limit the scope of the invention.

The growth of oxide thin films described herein was performed in a MBE apparatus of the type generally described by A. Y. Cho et al in *Progress in Solid-State Chemistry*, Vol. 10, Part 3, pp. 157-191, Pergamon Press (1975). As shown in FIG. 3 of Cho et al, the effusion cells, which contain source materials, are separated from the substrate. Thus, the source materials (such as the solid oxygen sources described herein) and the substrate are physically separate from one another. Extensive liquid nitrogen cryopanels were used in the belljar chamber although not around the effusion cells.

Polished, Si-doped, (100)-oriented, $n^+$-GaAs substrates were cleaned in organic solvents and free etched in hot $H_2SO_4:H_2O_2:H_2O$ (7:1:1). The substrates were mounted using In as a solder on molybdenum blocks and loaded directly into the growth chamber. The system was pumped down to $10^{-6}$ Torr before flowing liquid nitrogen in the cryopanels, which reduced the pressure to the high $10^{-8}$ Torr range. After outgassing the effusion cells for about 45 minutes at or above operating temperature, the substrate was heated to about 600° C. for five minutes to desorb any native oxide on the GaAs substrate, and then the temperature was set to that desired for growth. The cell containing $M_rO_s$ was heated to yield a beam suitable for growth. For example, the cell containing $Sb_2O_3$ was held at 380° C. yielding a beam equivalent pressure in the mid $10^{-7}$ Torr at the substrate for the films grown at about 0.2 μm/hr., whereas the cell containing $As_2O_3$ was held at 100° C. yielding a beam equivalent in the mid $10^{-6}$ Torr range for films grown at about 3 μm/hr. The beam fluxes were also observed using a UTI Quadrupole Mass Spectrometer (QMS) with 0-400 AMU range. The growth surface crystallinity was monitored using 8 keV Reflection Electron Diffraction (RED).

A number of oxides were tried as the oxygen source, $M_rO_s$. As mentioned previously, this oxide should sublime congruently; i.e., it should not decompose into unbonded O atoms or $O_2$ molecules. This decomposition was studied by subliming the oxides in effusion cells in line-of-sight of the QMS. Two oxides were found to be unsuitable: PbO and $Bi_2O_3$ both decomposed as evidenced by the low ratio of the PbO:Pb and BiO:Bi peaks from the cracking patterns of the QMS. Also, when the line-of-sight path between the heated effusion cell and the ion gauge was blocked with a shutter, the readings did not change, thereby indicating that the oxide had decomposed producing a high oxygen background. On the other hand, both $Sb_2O_3$ and $As_2O_3$ were found to be suitable oxygen sources: both sublimed congruently as evidenced by the high ratio (about 10:1) of the SbO:Sb and AsO:As peaks from the cracking patterns of the QMS. However, $Sb_2O_3$ was chosen over $As_2O_3$ as the oxygen source for growth of most of the oxide thin films decribed below only because of its lower vapor pressure ($\sim 10^{-2}$ Torr for $Sb_2O_3$ as compared with $\sim 10^2$ Torr for $As_2O_3$ at 400° C.). When the line-of-sight path between the heated $Sb_2O_3$ cell and the QMS was shuttered, the SbO peak dropped by a factor $>10^4$ within a few seconds. For other applications, possibly room temperature growth, the higher vapor pressure $As_2O_3$ might be preferred.

The results using the inventive growth technique are summarized in Table I. The oxide nature of the films was readily apparent after growth from the interference colors as well as the high resistivity, hardness, and chemical etching characteristics. The thickness and refractive index of the films were determined using ellipsometry. Further evidence of the oxide nature was provided by Auger Electron Spectroscopy (AES) and X-Ray Photoelectron Spectroscopy (XPS). The shift in energy of the Mg, Al, and Si peaks from the elemental peaks indicates that the atoms are bonded to oxygen. Also AES and XPS reveal that low levels of Sb ($<5$ atomic %) are incorporated into the films. The higher values of index of refraction n correlate with lower oxygen content of the films. Note the deviations of n for some of these films from the stoichiometric values (1.65, 1.74, and 1.45 for $Al_2O_3$, MgO and $SiO_2$, respectively). XPS atomic concentration results are summarized in Table II. The high level of carbon incorporation probably results from the high background CO levels in the chamber and should be lower in a cleaner system.

$Al_2O_3$ films were grown with both $As_2O_3$ and $Sb_2O_3$ as the oxygen source. Films 1-3 were grown at the highest growth rate of 3 $\mu$m/hr. at 600° C. while the other films were grown at 0.2 $\mu$m/hr. Growths at temperatures from 350° C. to 750° C. were successful, but growth at room temperature failed because the $Sb_2O_3$ did not evaporate from the growth surface. However, theory indicates that use of a higher vapor pressure oxygen source will enable room temperature growth. The resitivity and breakdown field of Film 2 were greater than $10^{13}$ $\Omega$-cm and $2 \times 10^6$ V/cm. For Film 5, grown at 350° C., sputter Auger measurements indicated a transition width of about 150 Å at the $Al_2O_3$-GaAs interface as shown in the Figure. A much higher transition width of about 900 Å resulted for growth at 750° C. for Film 6.

In addition to $Al_2O_3$, films of MgO, $SiO_2$, and the spinel $MgO:Al_2O_3(MgAl_2O_4)$ were also grown. All MgO films had a rough morphology while the other films had a smooth surface as viewed on a Nomarski interference contrast microscope. No evidence of pinholing was found after placing the samples in a GaAs etch, $NH_3OH:H_2O_2:H_2O$ (1:1:3), for 15 minutes. All films were able to pass an adherence test using adhesive tape. While all $Al_2O_3$ and $SiO_2$ films were amorphous, all MgO and $MgO:Al_2O_3$ films were polycrystalline with increasing orientation at higher growth temperatures.

Similar to the work of R. W. Grant et al, supra, Al was evaporated in an ambient of $10^{-5}$ Torr with the Al flux and growth temperature identical to that used for Sample 5. Instead of an oxide film such as Sample 5, a metallic film resulted in spite of the fact that the $O_2$/Al flux ratio ($<100$) was much higher than the antimony oxide/Al flux ratio ($\sim 2$). Of course, thermodynamics indicates that Al will oxidize at 350° C. in $10^{-5}$ Torr of $O_2$. However, for the oxide growth attempts in $\sim 10^{-5}$ Torr of $O_2$, the kinetics of the reaction of Al with $O_2$ are the limiting factor; i.e., the surface residence time of $O_2$ is short compared to the time needed for Al and $O_2$ to react. Thus, when using the Grant et al technique, either high $O_2$ pressures or slow growth rates are necessary to form the $Al_2O_3$ layers. Because of the lower vapor pressure of $Sb_2O_3$ and $As_2O_3$, the surface residence time of these oxides is much longer than for $O_2$. The kinetics of the reaction of Al with $Sb_2O_3$ and $As_2O_3$ did not appreciably limit the oxidation of Al even at a growth rate of 3 $\mu$m/hr. Evidence of this effect is given by the low index of refraction, which indicates high oxygen incorporation, of Sample 1. Sample 3, also grown at 3 $\mu$m/hr., had a high index of refraction (see Table I) and a correspondingly low oxygen incorporation (see Table II). However, the low oxygen level was presumably due to the low $Sb_2O_3$/Al flux ratio used for this sample (about 0.2 of the flux ratio used for other samples). However, in spite of the lower flux ratio, Sample 3 had more than twice the antimony concentration of the samples grown at 0.2 $\mu$m/hr. Thus, the desorption of the $Sb_rO_{s-n}$ before burial will probably limit the growth rate of $Al_2O_3$ before the kinetics of the reaction of Al with $Sb_2O_3$.

Sample 1, grown at a 3 $\mu$m/hr., but with a much higher flux ratio of $As_2O_3$/Al than the flux ratio of $Sb_2O_3$/Al of Sample 3, had a much lower Group V concentration (1% As vs. 5% Sb) because of the higher vapor pressure of the $As_2O_3$. Also the kinetics of the reaction of Al with $Sb_2O_3$ are expected to be slower than with the less stable $As_2O_3$.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

In particular, while most of the films described above were binary oxides, growth of mixed oxides such as $MgO:Al_2O_3$ (Sample 11) was straightforward. The technique is also applicable to the growth of many ternary oxide films which are of importance as display materials (e.g., $Y_3Al_5O_{12}$) and as electrooptic materials (e.g., $LiNiO_3$). In addition, while the above experiments utilized a GaAs substrate, other substrates are also suitable, e.g., other Group III-V compounds, such an InP; elemental semiconductors such as Si; metals such as Al; and dielectrics such as sapphire. Moreover, the oxygen source is not limited to the Group V oxides described. It is expected that oxides of Group VI elements such as S, Se, and Te would also be appropriate.

While none of the oxide films grown were single crystals, the MgO and $MgO:Al_2O_3$ films, which both have a face-centered cubic structure with about 5% lattice mismatch to GaAs, were polycrystalline. All $Al_2O_3$ and $SiO_2$ films, which have a much greater mismatch to GaAs, were amorphous. Thus, better crystallinity is expected for oxide films that lattice match the substrate.

A MBE apparatus is particularly useful for growth of these oxide films. The same thickness uniformity and control that MBE provides for semiconductors and metals is obtainable for the oxide films. Growth of metal-oxide and semiconductor-oxide layered structures is possible by control of the oxygen source effusion cell shutter.

Nevertheless, for other applications a MBE system may not be neccessary. For example, a system designed for inert gas flow through the chamber may be suitable, but in general a high vacuum system with the capability

TABLE I

The index of refraction (n), thickness (t), growth rate (r), substrate temperature ($T_s$), and oxygen source are tabulated below:

| Sample | Material | n | t(μm) | r(μm/hr) | $T_s$(°C.) | Oxygen Source |
|---|---|---|---|---|---|---|
| 1. | $Al_2O_3$ | 1.58 | 2 | 3 | 600 | $As_2O_3$ |
| 2. | $Al_2O_3$ | 1.7 | 2 | 3 | 600 | $As_2O_3$ |
| 3. | $Al_2O_3$ | 2.7 | 2 | 3 | 600 | $Sb_2O_3$ |
| 4. | $Al_2O_3$ | 1.64 | 0.09 | 0.2 | 750 | $Sb_2O_3$ |
| 5. | $Al_2O_3$ | 1.62 | 0.13 | 0.2 | 350 | $Sb_2O_3$ |
| 6. | $Al_2O_3$ | 1.65 | 0.10 | 0.2 | 750 | $Sb_2O_3$ |
| 7. | MgO | 1.9 | 0.06 | 0.1 | 500 | $Sb_2O_3$ |
| 8. | MgO | 1.8 | 0.10 | 0.2 | 500 | $Sb_2O_3$ |
| 9. | MgO | 1.3 | 0.06 | 0.1 | 650 | $Sb_2O_3$ |
| 10. | $SiO_2$ | 1.63 | 0.1 | 0.2 | 650 | $Sb_2O_3$ |
| 11. | $MgAl_2O_4$ | 1.6 | 0.2 | 0.2 | 600 | $Sb_2O_3$ |

TABLE II

| Sample | Concentration (Atomic %) | | | | | | | |
|---|---|---|---|---|---|---|---|---|
| | O | C | Mg | Al | Si | As | Ga | Sb |
| 3. | 41.1 | 5.8 | | 48.6 | | | | 4.5 |
| 6. | 47.3 | 8.5 | | 34.1 | | | 6.7 | 2.8 |
| 7. | 52.2 | 6.3 | | 37.5 | | 2.2 | | 1.6 |
| 9. | 50.3 | 15.4 | 29.5 | | | 0.9 | | 3.6 |
| 10. | 49.9 | 9.4 | | | 38 | | | 2.7 |
| 11. | 43.6 | 4.5 | 21.4 | 27.5 | | | | 3.0 |

What is claimed is:

1. A method of fabricating a device including an oxide film $R_mO_n$, where R is at least one metal or at least one semiconductor, or combination thereof, and m and n are integers, comprising the steps of:
   (a) mounting a substrate in a chamber,
   (b) providing in the chamber a solid source of an oxygen compound, which is separate from the substrate and which does not contain R,
   (c) providing an unoxidized source of R in the chamber, and
   (d) heating the sources to evaporation, the evaporants reacting to form the oxide film $R_mO_n$ on the substrate.

2. The method of claim 1 wherein the solid oxygen source comprises an oxide $M_rO_s$, which is less thermodynamically stable than the oxide $R_mO_n$, where M is at least one metal or at least one semiconductor, or combination thereof, where R contains no M and where r and s are integers.

3. The method of claim 2 wherein the oxide $M_rO_s$ sublimates congruently.

4. The method of claim 3 wherein the reaction on the substrate takes place as follows:

$$mR + M_rO_s \rightarrow R_mO_n + M_rO_{s-n}.$$

5. The method of claim 4 wherein the temperature of the substrate is high enough to desorb $M_rO_{s-n}$.

6. The method of claims 1, 2, 3, 4, or 5 wherein the oxide $R_mO_n$ is selected from the group consisting of $Al_2O_3$, MgO, $SiO_2$, and $MgAl_2O_4$.

7. The method of claim 6 where the temperature of the substrate is between 350° C. and 750° C., approximately.

8. The method of claims 1 or 2 including, after step (a), lowering the pressure of the chamber to a subatmospheric pressure.

9. The method of claims 1, 2, 3, 4, or 5 wherein the oxygen source comprises a binary oxide.

10. The method of claim 9 wherein the binary oxide is selected from the group consisting of $As_2O_3$ and $Sb_2O_3$.

11. A method fabricating a device including an oxide film $R_mO_n$, where R is at least one metal or at least one semiconductor, or combination thereof, and m and n are integers, comprising the steps of:
   (a) mounting a substrate in an evacuable chamber,
   (b) lowering the pressure of the chamber to a subatmospheric pressure,
   (c) providing a solid oxygen source of an oxide $M_rO_s$ which is separate from the substrate and which sublimates congruently, where M is at least one metal or at least one semiconductor, or a combination thereof, and R and M are mutually exclusive,
   (d) providing an unoxidized source of R in the chamber,
   (e) heating the sources to form molecular beams which react as follows:

$$mR + M_rO_s \rightarrow R_mO_n + M_rO_{s-n}$$

thereby forming the oxide films $R_mO_n$ on the substrate, where $M_rO_{s-n}$ is less thermodynamically stable than the oxide $R_mO_n$, the temperature of the substrate is high enough to desorb $M_rO_{s-n}$, and r, s, m and n are integers.

* * * * *